(12) United States Patent
Liu et al.

(10) Patent No.: US 9,387,664 B2
(45) Date of Patent: Jul. 12, 2016

(54) SLIT-TYPE SCRAPER DEVICE

(71) Applicant: Metal Industries Research & Development Centre, Kaohsiung (TW)

(72) Inventors: Kuan-Chih Liu, Kaohsiung (TW); Chorng-Tyan Lin, Kaohsiung (TW); Ho-Chung Fu, Kaohsiung (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 0 days.

(21) Appl. No.: 14/955,127

(22) Filed: Dec. 1, 2015

(65) Prior Publication Data

US 2016/0159073 A1 Jun. 9, 2016

(30) Foreign Application Priority Data

Dec. 5, 2014 (TW) .............................. 103142402 A

(51) Int. Cl.
| | |
|---|---|
| *B41F 15/44* | (2006.01) |
| *B41F 15/40* | (2006.01) |
| *B41F 15/42* | (2006.01) |
| *B41F 15/46* | (2006.01) |
| *B23K 3/06* | (2006.01) |
| *H05K 3/12* | (2006.01) |

(52) U.S. Cl.
CPC . *B41F 15/44* (2013.01); *B23K 3/06* (2013.01); *B41F 15/40* (2013.01); *B41F 15/42* (2013.01); *B41F 15/46* (2013.01); *H05K 3/1233* (2013.01); *H05K 2203/0126* (2013.01)

(58) Field of Classification Search
CPC .......... B41F 15/40; B41F 15/42; B41F 15/44; B41F 15/46; B05D 1/28; B23K 3/06; B23K 3/0638; H05K 3/34; H05K 3/1233; H05K 2203/0126
See application file for complete search history.

(56) References Cited

U.S. PATENT DOCUMENTS

| | | | | |
|---|---|---|---|---|
| 3,738,790 | A * | 6/1973 | Violette | B29C 47/00 425/380 |
| 4,675,208 | A * | 6/1987 | Kageyama | B05C 1/0813 118/259 |
| 5,191,709 | A * | 3/1993 | Kawakami | H05K 3/4053 174/263 |
| 5,590,596 | A * | 1/1997 | Tani | B41F 15/0818 101/115 |
| 5,824,155 | A * | 10/1998 | Ha | H05K 3/1233 118/406 |
| 6,171,399 | B1 * | 1/2001 | Kaiser | B05D 1/26 118/406 |
| 6,423,141 | B1 * | 7/2002 | Lin | B41F 15/40 118/413 |
| 6,746,710 | B1 * | 6/2004 | Lambert | B23K 3/0607 427/282 |
| 6,813,820 | B2 * | 11/2004 | Nelson | B05C 5/007 118/406 |
| 9,132,497 | B2 * | 9/2015 | Sato | B23K 3/0638 |
| 2002/0053293 | A1 * | 5/2002 | Elkis | B41F 21/00 101/132 |

(Continued)

*Primary Examiner* — Blake A Tankersley
*Assistant Examiner* — Marissa Ferguson Samreth
(74) *Attorney, Agent, or Firm* — Juan Carlos A. Marquez; Marquez IP Law Office, PLLC

(57) ABSTRACT

A slit-type scraper device includes: a body, a first scraper portion, a cover, a second scraper portion, an air pressure through hole and a side cover unit. The body includes a groove and a slit portion abutting against the groove. The first scraper portion is abutting against the slit portion. The cover includes a plate portion. The second scraper portion is abutting against the plate portion, wherein the position of the second scraper portion is corresponding to the first scraper portion. The air pressure through hole is disposed on the body, in communication with the groove, and adapted to connect an air pressure connection member to input air pressure. The side cover unit is adapted to form an ink storage space between the plate portion and the groove, and form an ink output slit between the slit portion and the plate portion.

16 Claims, 7 Drawing Sheets

(56) References Cited

U.S. PATENT DOCUMENTS

2004/0080075 A1* 4/2004 Pekurovsky ............ B05C 5/025
264/176.1

2013/0047877 A1* 2/2013 Yoo ........................ H01L 31/00
101/364

* cited by examiner

SLIT-TYPE SCRAPER DEVICE

CROSS-REFERENCE TO RELATED APPLICATION

This application claims the benefit of Taiwan Patent Application No. 103142402, filed on Dec. 5, 2014, which is hereby incorporated by reference for all purposes as if fully set forth herein.

BACKGROUND

1. Technical Field

The present invention relates to a scraper device, and in particular, to a slit-type scraper device, which combines an ink storage space and a scraper, and uses air pressure to assist power for pushing printing ink, so that the printing ink can be outputted through an ink output slit, thereby achieving the effect of direct ink supplying.

2. Related Art

Currently, environmental protection and portability have been increasingly emphasized, and reducing use of papers is a common object of preventing global warming. In recent years, electronic industries apply many printing technologies to manufacture electronic products, for example, manufacturing electronic elements by printing, printing circuits on a circuit board, or conducting a step of applying printing ink or slurry during an attachment process. In various printing technologies, a screen printing technology has been widely applied to surface machining of various objects.

During a conventional screen printing process, mostly, printing ink is first applied to a screen cloth, and an ink reclaiming knife is used to uniformly apply the ink on a scope that needs printing, and the process action is referred to as ink applying. Then, an appropriate pitch is adjusted to match with an appropriate attack angle, speed, pressing force of a scraper, so as to conduct the screen printing.

In order to implement pattern transfer, the scraper needs to form an attack angle with the screen, and establishes a downward component and a past roll force of the printing ink with the angle, the printing ink may generate an ink filling action under the two forces, and a sharp end of the scraper attaches the printing ink on a substrate.

However, the conventional scraper technology has the following problems: the printing pressing is difficult to control, and printing parameters, such as a scraper angle, a scraping speed, and a pitch, always need to be adjusted due to different printing ink viscosity, different screen cloth density and different printing resolution. Another problem is an unstable attack angle, and when a printing condition requires increased press amount, a soft squeegee will deform, and because a part of pressure is absorbed by the deformation of the squeegee, the attack angle is affected, so that the printing is even more unstable. Finally, when applying a solvent type printing ink, an area of the printing ink in contact with the air is increased, which accelerates volatilization of a solvent of the printing ink, so that the printing ink becomes more viscous and more difficult in printing.

Therefore, it is required to provide a scraper device to solve the above problems.

SUMMARY

An objective of the present invention is to provide a slit-type scraper device, which combines an ink storage space and a scraper, and uses air pressure to assist power for pushing printing ink, so that the printing ink can be outputted through an ink output slit, thereby achieving the effect of direct ink supplying, and preventing the printing ink from directly contacting with the air; therefore, the air material will not be easily volatilized and dried during screen printing. In addition, a gap of the ink output slit of the scraper has an extremely good effect when being applied to the printing of a fine circuit. The scraper is of a special design in an arc shape, so that a screen cloth can completely cover the scraper, and therefore, problems such as that the scraper deforms to affect the attack angle will not occur, and the printing is more stable.

A slit-type scraper device of the present invention is applicable to screen printing, and comprises: a body, having an inner side, and comprising: a groove; a first combination portion abutting against one side of the groove; and a slit portion abutting against the other side of the groove, wherein the first combination portion extrudes from a plane of the slit portion; and a first scraper portion, abutting against one side of the slit portion; a cover, having an inner side, and comprising: a plate portion; and a second combination portion abutting against one side of the plate portion, wherein the second combination portion is physically connected to the first combination portion; a second scraper portion abutting against the other side of the plate portion, wherein the position of the second scraper portion is corresponding to the first scraper portion; an air pressure through hole, disposed on the body, in communication with the groove, and adapted to connect the air pressure connection member to input air pressure; and a side cover unit, assembled and connected to side edges of the body and the cover, and adapted to form an ink storage space between the plate portion and the groove, and form an ink output slit between the slit portion and the plate portion.

The slit-type scraper device of the present invention combines the ink storage space and the arc-shaped first and second scraper portions, and therefore, during printing of a fine circuit, even there is printing ink leaks, the arc-shaped scraper can still conduct the scraping action, which not only saves the action of ink reclaiming, but also presents finer line paths at the printing of fine circuits.

In addition, the present invention has an ink storage groove design, thereby avoiding the printing ink from being exposed to the air to accelerate the volatilization of solvent. In the present invention, the ink storage groove is combined with the scraper, so as to isolate the air to prevent the printing ink from volatilizing. Then, the air pressure is used to assist the power for pushing, so that the printing ink can be outputted through the ink output slit, thereby achieving the effect of direct ink supplying and direct pattern transferring.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

In order to make the above and other objectives, features and advantages of the present invention clearer, the present invention is described in detail below through the accompanying drawings.

Figure 1:
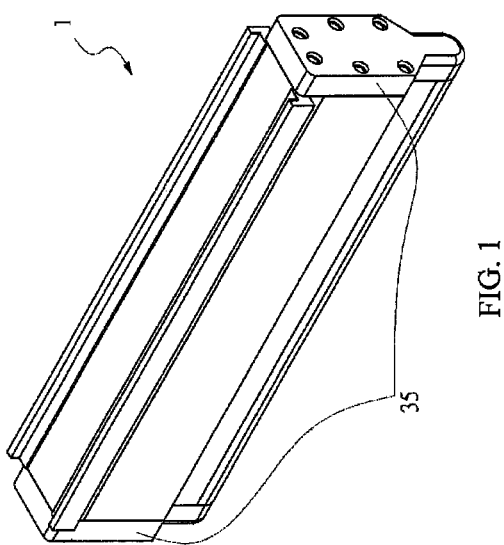
FIG. 1 is a schematic three-dimensional combination view of a slit-type scraper device according to an embodiment of the present invention.
Figure 2:
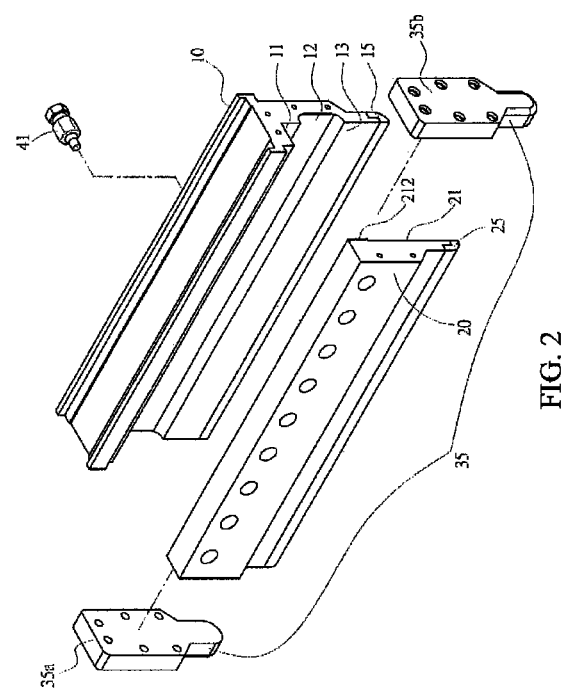
FIG. 2 is a schematic three-dimensional exploded view of a slit extruding-type scraper device according to an embodiment of the present invention.
Figure 3:
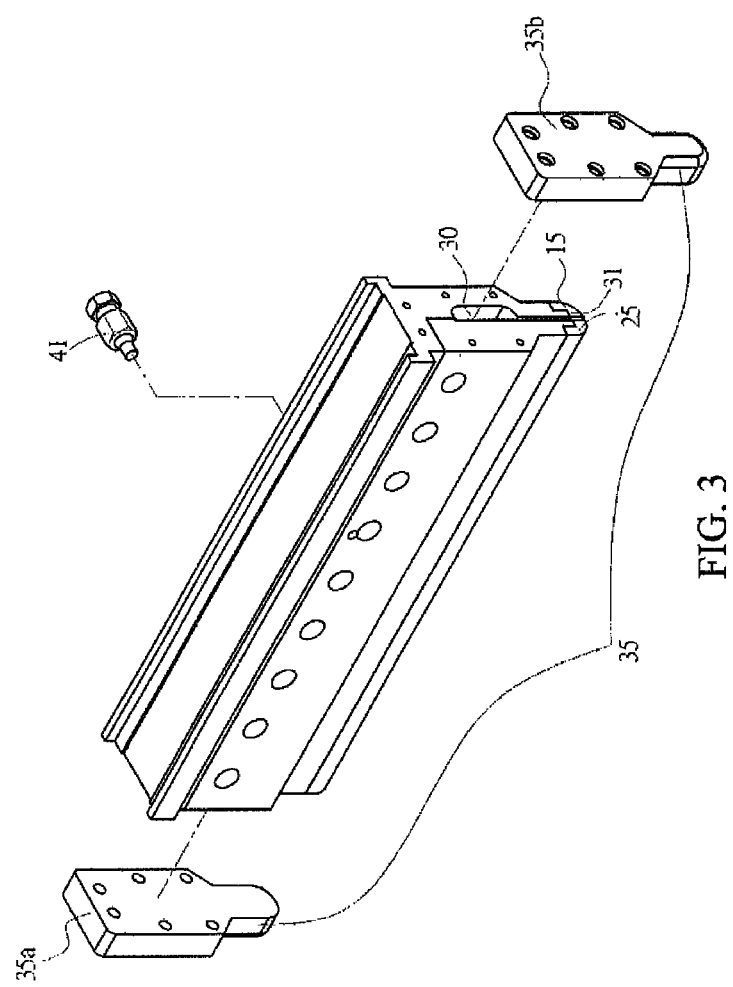
FIG. 3 is a schematic three-dimensional view of combining a body and a cover according to an embodiment of the present invention.
Figure 4:
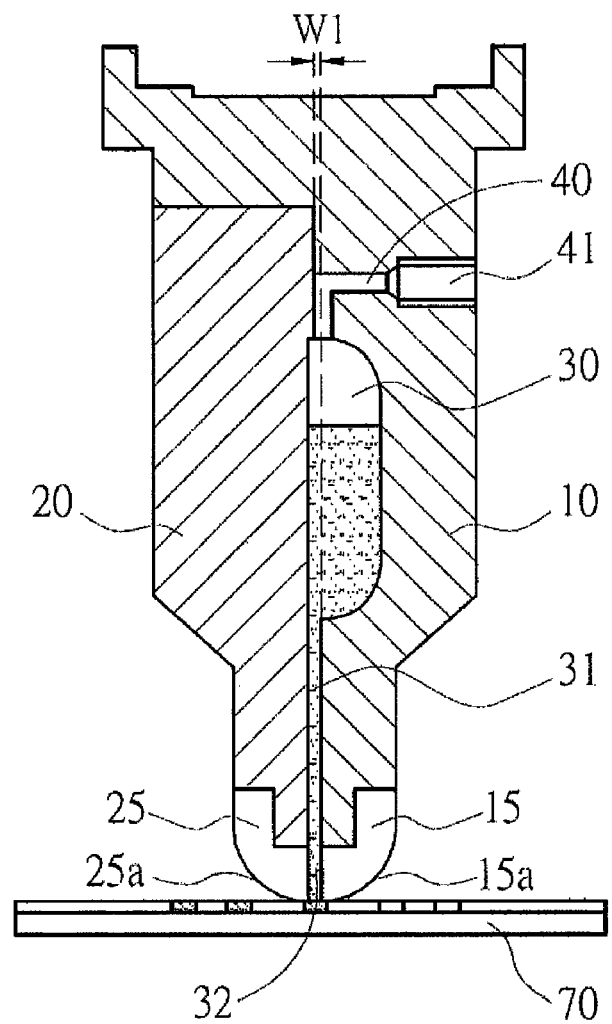
FIG. 4 is a schematic sectional view of a slit extruding-type scraper device according to an embodiment of the present invention.

FIG. 1 is a schematic three-dimensional combination view of a slit-type scraper device according to an embodiment of the present invention, FIG. 2 is a schematic three-dimensional exploded view of a slit extruding-type scraper device according to an embodiment of the present invention, FIG. 3 is a schematic three-dimensional view of combining a body and a cover according to an embodiment of the present invention, and FIG. 4 is a schematic sectional view of a slit extruding-type scraper device according to an embodiment of the present invention, A slit-type scraper device 1 of the present invention is applicable to screen printing 70, but is not limited thereto. Referring to FIG. 1 to FIG. 4, the slit-type scraper device 1 includes: a body 10 and a cover 20. An inner side of the body 10 is provided with a groove 12, a first combination portion 11 abutting against one side of the groove 12 and a slit portion 13 abutting against the other side of the groove 12, wherein one side of the slit portion 13 abuts against the first scraper portion 15. In other words, one side of the slit portion 13 abuts against the first scraper portion 15, and the other side of the slit portion 13 abuts against the groove 12. The first combination portion 11 and the slit portion 13 may be made of the same material (for example, metal) integrally. The first scraper portion 15 may be made of a polymer material.

Referring to FIG. 4, the first combination portion 11 and the slit portion 13 each have a plane, there is a vertical distance W1 between the plane of the first combination portion 11 and the plane of the slit portion 13, and the plane of the first combination portion 11 is higher than the plane of the slit portion 13, in other words, the first combination portion 11 protrudes from the plane of the slit portion 13.

A cover 20 is combined to the body 10, an inner side of the cover 20 is provided with a plate portion 21 and a second combination portion 212, one side of the plate portion 21 abutting against the second combination portion 212, and the other side of the plate portion 21 abutting against the second scraper portion 25, wherein the second combination portion 212 is combined and connected to the first combination portion 11, and the position of the second scraper portion 25 corresponds to the position of the first scraper portion 15. The plate portion 21 and the second combination portion 212 may also be made of the same material (for example, metal) integrally. The second scraper portion 25 may also be made of a polymer material.

As described in the foregoing, in an embodiment, the first scraper portion 15 has a first scraping surface 15a, the first scraping surface 15a is an arc-shaped surface, the second scraper portion 25 has a second scraping surface 25a corresponding to the first scraping surface 15a, and the second scraping surface is an arc-shaped surface. Moreover, a combination of the first scraping surface 15a and the second scraping surface 25 has a semicircular surface.

In addition, the body 10 is provided with an air pressure through hole 40, is in communication with the groove 12, and is adapted to connect an air pressure connection member 41 to input air pressure, so that the printing ink stored in an ink storage space 30 may be pushed by the air pressure for output, and therefore, the pressure value of the air pressure mainly corresponds to the viscosity of the printing ink. For example, the printing ink having a high viscosity needs to be pushed for output by a high air pressure value, and the printing ink having a low viscosity needs to be pushed for output by a low air pressure value, therefore, the printing ink is controlled to have an appropriate output quantity.

Referring to FIG. 3 and FIG. 4, the slit-type scraper device 1 further includes a side cover unit 35, assembled and connected to side edges of the body 10 and the cover 20. Specifically, the side cover unit 35 includes first and second side covers 35a, 35b respectively assembled and connected to two side edges of the body 10 and the cover 20, and therefore, whereby the side cover unit 35, the plate portion 21 and the groove 12 form an ink storage space 30, and the side cover unit 35, the slit portion 13 and the plate portion 21 form an ink output slit 31. In this embodiment, the side cover unit 35 may screw the body 10 and the cover 20 together by using a screw (not shown), so as to complete the combination of the slit-type scraper device 1.

As described in the foregoing, in an embodiment, the plate portion 21 may be provided with another groove (not shown) corresponding to the groove 12. When the first combination portion 11 and the second combination portion 212 are assembled and connected, the groove and the other groove can form a larger ink storage space 30.

The first combination portion 11 protrudes from the plane of the slit portion 13, in other words, the plane of the first combination portion 11 is higher than the plane of the slit portion 13. Therefore, when the first combination portion 11 and the second combination portion 212 are assembled and connected, the slit portion 13 will form the ink output slit 31, and when the printing ink fills the ink storage space, in this case, the ink storage space is an enclosed space, and the printing ink is pushed by the air pressure and is outputted through the ink output slit 31.

In addition, one side of the slit portion 13 abuts against the first scraper portion 15, and the first scraper portion 15 corresponds to the second scraper portion 25; therefore, when the first combination portion 11 and the second combination portion 212 are assembled and connected, the first scraper portion 15 and the second scraper portion 25 are located at an ink output port of the ink output slit 31. Further, a strip-shaped gap 32 is formed between the second scraper portion 25 and the first scraper portion 15, and is in communication with the ink output slit 31.

Figure 5:
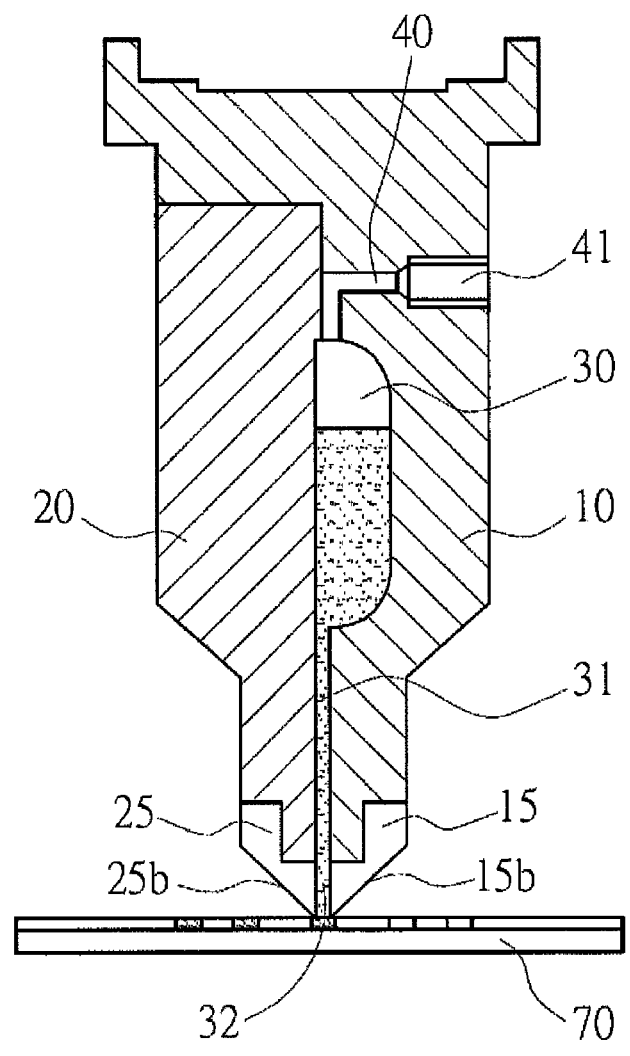
FIG. 5 is a schematic sectional view of a slit-type scraper device according to another embodiment of the present invention.

Referring to FIG. 5. FIG. 5 is a schematic sectional view of a slit-type scraper device according to another embodiment of the present invention, the slit-type scraper device of the another embodiment is substantially similar to the foregoing slit-type scraper device, and a difference lies in that: the first scraper portion 15 has a first scraping surface 15b, the first scraping surface 15b being an inclined surface, and the second scraper portion 25 has a second scraping surface 25b corresponding to the first scraping surface 15b, the second scraping surface 25b being an inclined surface. A combination of the first scraping surface 15b and the second scraping surface 25b can form an inverted triangular surface.

Figure 6:
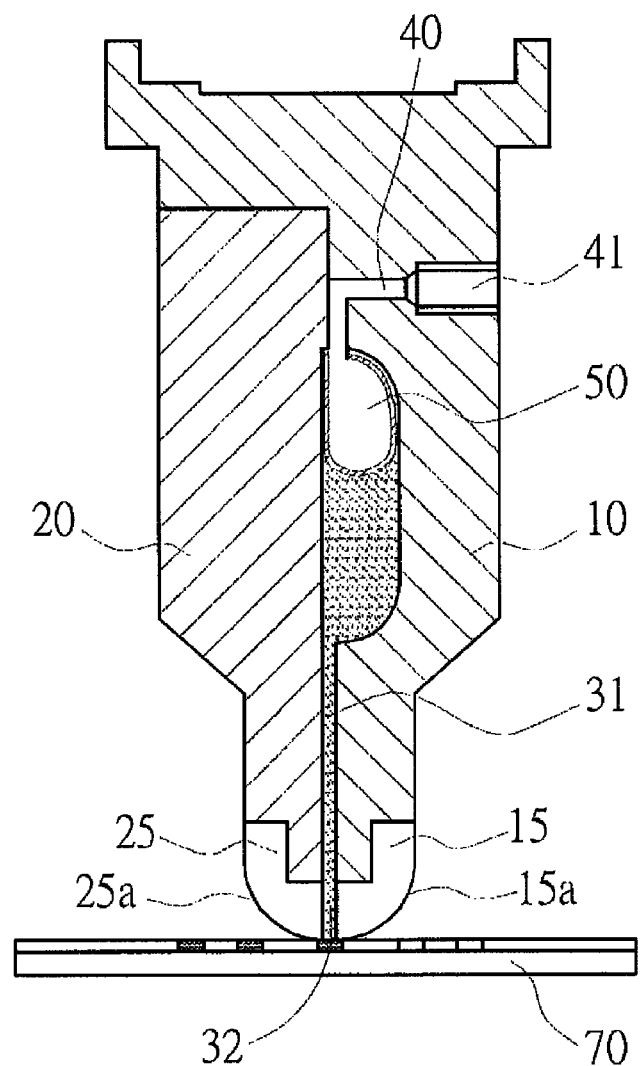
FIG. 6 is a schematic sectional view of a slit-type scraper device according to still another embodiment of the present invention.

FIG. 6 is a schematic sectional view of a slit-type scraper device according to still another embodiment of the present invention. In the still another embodiment, an air envelope 50 can be further dispose in the ink storage space 30 in the present invention. Referring to FIG. 5, the slit-type scraper device further includes an air envelope 50 disposed in the ink storage space 30, and the air envelope 50 is in communication with the air pressure through hole 40, and expands after receiving the air pressure.

As described in the foregoing, when the concentration of the printing ink is high or the printing ink is viscous, the air pressure must be increased to push the printing ink; otherwise, there will be a phenomenon of uneven pressure application. Therefore, the air pressure is outputted to the air envelope 50, so that the air envelope 50 expands to apply the pressure to the printing ink evenly, and therefore, the printing ink can be outputted uniformly.

Figure 7:
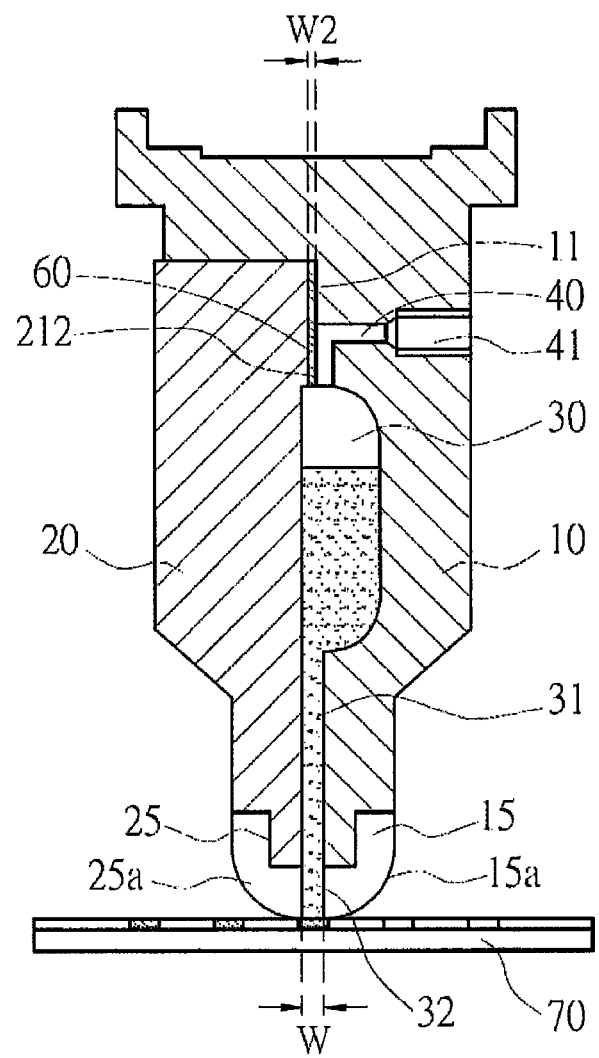
FIG. 7 is a schematic sectional view of a slit-type scraper device according to yet another embodiment of the present invention.

FIG. 7 is schematic sectional view of a slit-type scraper device according to yet another embodiment of the present invention. In addition, in the yet another embodiment, to adjust the ink output quantity, the width W of the ink output slit 31 can be increased, and therefore, a slit width adjusting pad 60 can be disposed between the second combination portion 212 and the first combination portion 11, the slit width adjusting pad 60 has a thickness W2. When the slit width adjusting pad 60 is disposed between the second combination portion 212 and the first combination portion 11, the width W of the ink output slit 31 is wider, and therefore, the width W of the ink output slit 31 can be increased freely.

As described in the foregoing, the width adjustment of the ink output slit 31 is not limited thereto. In another embodiment, the second combination portion 212 may protrude from the plane of the plate portion 21, in other words, there is a vertical distance between the plane of the second combination portion 212 and the plane of the plate portion 21, and the second combination portion 212 protrudes from the plate portion 21 to form a step; by using the step, the width of the ink output slit 31 may be increased.

The slit-type scraper device provided in the present invention combines the ink storage space and the scraper, and uses air pressure to assist power for pushing printing ink, so that the printing ink can be outputted through the ink output slit, thereby achieving the effect of direct ink supplying. In addition, in the prior art, during screen printing, mostly ink is applied to a screen cloth before printing is conducted, and this action exposes the printing ink to the air, which accelerates volatilization of solvent. In the present invention, the ink storage space is combined to the scraper portion, not only the ink storage space can isolate the air to prevent the printing ink from volatilizing, but also an ink reclaiming knife is not required, so as to reduce the action of ink reclaiming in the process.

In addition, during printing of a fine circuit, a scraper head (the combination of the first scraper portion 15 and the second scraper portion 25) has a semicircular section design, so that the printing ink can exude, and the arc-shaped portion can still conduct the action of scraping, so that line paths presented during the printing of the fine circuit are finer.

In view of the above, implementations or embodiments presenting technical solutions used for solving problems are described in the present invention, and they are not intended to limit the implementation scope of the present invention. Those meeting the meanings of the scope of the present invention and equivalent variations and modifications made according to the scope of the present invention shall fall within the scope of the present invention.

What is claimed is:

1. A slit-type scraper device, applicable to screen printing, comprising:
   a body, having an inner side, and comprising:
   a groove;
   a first combination portion, abutting against one side of the groove; and
   a slit portion, abutting against the other side of the groove, wherein the first combination portion protrudes from a plane of the slit portion;
   a first scraper portion, abutting against one side of the slit portion;
   a cover, having an inner side, comprising:
   a plate portion; and
   a second combination portion, abutting against one side of the plate portion, wherein the second combination portion is physically connected to the first combination portion;
   a second scraper portion, abutting against the other side of the plate portion, wherein a position of the second scraper portion is corresponding to the first scraper portion;
   an air pressure through hole, disposed on the body, in communication with the groove, and adapted to connect an air pressure connection member to input an air pressure; and
   a side cover unit, assembled and connected to side edges of the body and the cover, and adapted to form an ink storage space between the plate portion and the groove, and form an ink output slit between the slit portion and the plate portion; and
   a slit width adjusting pad, located between the second combination portion and the first combination portion, and adapted to adjust a width of the ink output slit.

2. The slit-type scraper device according to claim 1, wherein the first scraper portion has a first scraping surface, the first scraping surface being an arc-shaped surface, and the second scraper portion has a second scraping surface corresponding to the first scraping surface, the second scraping surface being an arc-shaped surface.

3. The slit extruding-type scraper device according to claim 1, wherein the first scraper portion has a first scraping surface, the first scraping surface being an inclined surface, and the second scraper portion has a second scraping surface corresponding to the first scraping surface, the second scraping surface being an inclined surface.

4. The slit-type scraper device according to claim 1, further comprising an air envelope, disposed in the ink storage space, the air envelope being in communication with the air pressure through hole and adapted to expand after receiving the air pressure.

5. The slit-type scraper device according to claim 1, further comprising: a printing ink, stored in the ink storage space, and pushed by the air pressure to be outputted through the ink output slit.

6. The slit-type scraper device according to claim 5, wherein the ink storage space storing the printing ink is an enclosed space.

7. The slit-type scraper device according to claim 1, wherein the first scraper portion and the second scraper portion are located at a position of the ink output slit for outputting the printing ink.

8. The slit-type scraper device according to claim 7, wherein a strip-shaped gap is formed between the second scraper portion and the first scraper portion, and is in communication with the ink output slit.

9. A slit-type scraper device, applicable to screen printing, comprising:
   a body, having an inner side, and comprising:
   a groove;
   a first combination portion, abutting against one side of the groove; and a slit portion, abutting against the other side of the groove, wherein the first combination portion protrudes from a plane of the slit portion;

a first scraper portion, abutting against one side of the slit portion;

a cover, having an inner side, comprising:
  a plate portion; and
  a second combination portion, abutting against one side of the plate portion, wherein the second combination portion is physically connected to the first combination portion;

a second scraper portion, abutting against the other side of the plate portion, wherein a position of the second scraper portion is corresponding to the first scraper portion;

an air pressure through hole, disposed on the body, in communication with the groove, and adapted to connect an air pressure connection member to input an air pressure; and a side cover unit, assembled and connected to side edges of the body and the cover, and adapted to form an ink storage space between the plate portion and the groove, and form an ink output slit between the slit portion and the plate portion;

wherein the second combination portion protrudes from the plate portion, to adjust a width of the ink output slit.

10. The slit-type scraper device according to claim 9, wherein the first scraper portion has a first scraping surface, the first scraping surface being an arc-shaped surface, and the second scraper portion has a second scraping surface corresponding to the first scraping surface, the second scraping surface being an arc-shaped surface.

11. The slit extruding-type scraper device according to claim 9, wherein the first scraper portion has a first scraping surface, the first scraping surface being an inclined surface, and the second scraper portion has a second scraping surface corresponding to the first scraping surface, the second scraping surface being an inclined surface.

12. The slit-type scraper device according to claim 9, further comprising an air envelope, disposed in the ink storage space, the air envelope being in communication with the air pressure through hole and adapted to expand after receiving the air pressure.

13. The slit-type scraper device according to claim 9, further comprising: a printing ink, stored in the ink storage space, and pushed by the air pressure to be outputted through the ink output slit.

14. The slit-type scraper device according to claim 13, wherein the ink storage space storing the printing ink is an enclosed space.

15. The slit-type scraper device according to claim 9, wherein the first scraper portion and the second scraper portion are located at a position of the ink output slit for outputting the printing ink.

16. The slit-type scraper device according to claim 15, wherein a strip-shaped gap is formed between the second scraper portion and the first scraper portion, and is in communication with the ink output slit.

* * * * *